(12) United States Patent
Pearman et al.

(10) Patent No.: US 9,038,003 B2
(45) Date of Patent: May 19, 2015

(54) METHOD AND SYSTEM FOR CRITICAL DIMENSION UNIFORMITY USING CHARGED PARTICLE BEAM LITHOGRAPHY

(71) Applicant: D2S, Inc., San Jose, CA (US)

(72) Inventors: Ryan Pearman, San Jose, CA (US); Robert C. Pack, Morgan Hill, CA (US); Akira Fujimura, Saratoga, CA (US)

(73) Assignee: D2S, Inc., San Jose, CA (US)

( * ) Notice: Subject to any disclaimer, the term of this patent is extended or adjusted under 35 U.S.C. 154(b) by 0 days.

(21) Appl. No.: 13/862,476

(22) Filed: Apr. 15, 2013

(65) Prior Publication Data

US 2013/0283216 A1    Oct. 24, 2013

Related U.S. Application Data

(60) Provisional application No. 61/625,932, filed on Apr. 18, 2012.

(51) Int. Cl.
*G06F 17/50* (2006.01)
*G03F 1/36* (2012.01)

(52) U.S. Cl.
CPC . *G06F 17/50* (2013.01); *G03F 1/36* (2013.01)

(58) Field of Classification Search
CPC . G06F 17/50; G06F 17/5009; G06F 17/5081; G06F 17/5068; G06F 17/2217; G03F 1/36; G03F 1/144; G03F 7/705; G03F 7/70441; H01L 22/20
USPC ............................................... 716/52, 53, 54
See application file for complete search history.

(56) References Cited

U.S. PATENT DOCUMENTS

| 4,634,871 | A |   | 1/1987 | Knauer |
|---|---|---|---|---|
| 4,698,509 | A |   | 10/1987 | Wells et al. |
| 4,818,885 | A |   | 4/1989 | Davis et al. |
| 5,103,101 | A |   | 4/1992 | Berglund et al. |
| 5,173,582 | A |   | 12/1992 | Sakamoto et al. |
| 5,334,282 | A |   | 8/1994 | Nakayama et al. |
| 5,723,237 | A | * | 3/1998 | Kobayashi et al. ............. 430/30 |

(Continued)

FOREIGN PATENT DOCUMENTS

| CN | 1193810 A | 9/1998 |
|---|---|---|
| EP | 1429368 A2 | 6/2004 |

(Continued)

OTHER PUBLICATIONS

Notice of Allowance and Fees dated Dec. 26, 2013 for U.S. Appl. No. 13/862,472.

(Continued)

*Primary Examiner* — Vuthe Siek
(74) *Attorney, Agent, or Firm* — The Mueller Law Office, P.C.

(57) ABSTRACT

A method for mask data preparation or mask process correction is disclosed in which a set of charged particle beam shots is determined which is capable of forming a pattern on a surface, wherein critical dimension uniformity (CDU) of the pattern is optimized. In some embodiments the CDU is optimized by varying at least two factors. In other embodiments, model-based techniques are used. In yet other embodiments, the surface is a reticle to be used in an optical lithographic process to form a pattern on a wafer, and CDU on the wafer is optimized.

29 Claims, 10 Drawing Sheets

(56) References Cited

U.S. PATENT DOCUMENTS

| | | | |
|---|---|---|---|
| 5,825,039 A | 10/1998 | Hartley | |
| 5,856,677 A | 1/1999 | Okino | |
| 6,037,601 A | 3/2000 | Okunuki | |
| 6,218,671 B1 | 4/2001 | Gordon et al. | |
| 6,262,427 B1* | 7/2001 | Gordon | 250/492.22 |
| 6,372,391 B1 | 4/2002 | Wolfe et al. | |
| 6,416,912 B1 | 7/2002 | Kobayashi et al. | |
| 6,557,162 B1 | 4/2003 | Pierrat | |
| 6,891,175 B2 | 5/2005 | Hiura | |
| 6,917,048 B2 | 7/2005 | Fujiwara et al. | |
| 7,150,949 B2* | 12/2006 | Askebjer et al. | 430/30 |
| 7,269,819 B2 | 9/2007 | Hoshino | |
| 7,759,027 B2 | 7/2010 | Fujimura et al. | |
| 7,799,489 B2 | 9/2010 | Fujimura et al. | |
| 8,473,875 B2 | 6/2013 | Fujimura et al. | |
| 8,501,374 B2 | 8/2013 | Fujimura et al. | |
| 2002/0020824 A1 | 2/2002 | Itoh | |
| 2002/0125444 A1 | 9/2002 | Kojima | |
| 2002/0129328 A1 | 9/2002 | Komatsuda | |
| 2003/0043358 A1 | 3/2003 | Suganuma et al. | |
| 2003/0082461 A1 | 5/2003 | Carpi | |
| 2003/0087191 A1 | 5/2003 | Lavallee et al. | |
| 2003/0159125 A1* | 8/2003 | Wang et al. | 716/19 |
| 2003/0203287 A1 | 10/2003 | Miyagawa | |
| 2004/0011966 A1 | 1/2004 | Sasaki et al. | |
| 2004/0099636 A1 | 5/2004 | Scipioni | |
| 2004/0131977 A1 | 7/2004 | Martyniuk et al. | |
| 2005/0053850 A1* | 3/2005 | Askebjer et al. | 430/5 |
| 2005/0075819 A1 | 4/2005 | Paxton et al. | |
| 2005/0211921 A1 | 9/2005 | Wieland et al. | |
| 2005/0221204 A1 | 10/2005 | Kimura | |
| 2005/0287451 A1 | 12/2005 | Hudek et al. | |
| 2007/0114463 A1 | 5/2007 | Nakasugi et al. | |
| 2007/0162889 A1 | 7/2007 | Broeke et al. | |
| 2007/0280526 A1 | 12/2007 | Malik et al. | |
| 2008/0054196 A1 | 3/2008 | Hiroshima | |
| 2008/0116398 A1 | 5/2008 | Hara et al. | |
| 2008/0213677 A1 | 9/2008 | Saito | |
| 2009/0200495 A1 | 8/2009 | Platzgummer | |
| 2010/0055580 A1 | 3/2010 | Fujimura et al. | |
| 2010/0055585 A1 | 3/2010 | Fujimura et al. | |
| 2010/0058279 A1 | 3/2010 | Fujimura et al. | |
| 2010/0058282 A1 | 3/2010 | Fujimura et al. | |
| 2010/0209834 A1 | 8/2010 | Yao et al. | |
| 2010/0264335 A1 | 10/2010 | Hoyle et al. | |
| 2010/0325595 A1* | 12/2010 | Song et al. | 716/108 |
| 2011/0033788 A1* | 2/2011 | Kato | 430/30 |
| 2011/0045409 A1 | 2/2011 | Fujimura | |
| 2011/0053056 A1 | 3/2011 | Fujimura et al. | |
| 2011/0116067 A1 | 5/2011 | Ye et al. | |
| 2011/0145769 A1 | 6/2011 | Wei | |
| 2011/0159435 A1 | 6/2011 | Zable et al. | |
| 2011/0177458 A1 | 7/2011 | Kotani et al. | |
| 2011/0191727 A1 | 8/2011 | Fujimura et al. | |
| 2012/0084740 A1 | 4/2012 | Fujimura et al. | |
| 2012/0149133 A1* | 6/2012 | Parrish et al. | 438/5 |
| 2012/0151428 A1* | 6/2012 | Tanaka et al. | 716/112 |
| 2012/0217421 A1 | 8/2012 | Fujimura et al. | |
| 2013/0070222 A1* | 3/2013 | Fujimura | 355/53 |
| 2013/0283218 A1 | 10/2013 | Fujimura et al. | |

FOREIGN PATENT DOCUMENTS

| | | |
|---|---|---|
| GB | 2367908 | 4/2002 |
| JP | S5425675 A | 2/1979 |
| JP | S54025675 | 2/1979 |
| JP | S608844 A | 1/1985 |
| JP | 61105839 | 5/1986 |
| JP | 63007631 | 1/1988 |
| JP | H02280315 A | 11/1990 |
| JP | 03205815 | 9/1991 |
| JP | H03205815 A | 9/1991 |
| JP | 04196516 | 7/1992 |
| JP | H04196516 A | 7/1992 |
| JP | 05036595 | 2/1993 |
| JP | H0536595 A | 2/1993 |
| JP | H05036595 | 2/1993 |
| JP | 05267133 | 10/1993 |
| JP | H05267133 A | 10/1993 |
| JP | H05335221 A | 12/1993 |
| JP | H0620931 A | 1/1994 |
| JP | H06020931 | 1/1994 |
| JP | 06124883 | 5/1994 |
| JP | 08055771 | 2/1996 |
| JP | H0855771 A | 2/1996 |
| JP | 08064522 | 3/1996 |
| JP | H08195339 A | 7/1996 |
| JP | 8222504 | 8/1996 |
| JP | H08222504 A | 8/1996 |
| JP | H09266153 A | 10/1997 |
| JP | 10294255 | 11/1998 |
| JP | H11111594 A | 4/1999 |
| JP | 11233401 | 8/1999 |
| JP | 2000091191 A | 3/2000 |
| JP | 2000123768 A | 4/2000 |
| JP | 2000138165 A | 5/2000 |
| JP | 2000269123 A | 9/2000 |
| JP | 2001013671 A | 1/2001 |
| JP | 2001093809 A | 4/2001 |
| JP | 2001203157 A | 7/2001 |
| JP | 2001230203 A | 8/2001 |
| JP | 2001305720 A | 11/2001 |
| JP | 2001313253 A | 11/2001 |
| JP | 2002075830 A | 3/2002 |
| JP | 2002110508 A | 4/2002 |
| JP | 2002202590 A | 7/2002 |
| JP | 2002217092 A | 8/2002 |
| JP | 2003195511 A | 7/2003 |
| JP | 2003315976 A | 11/2003 |
| JP | 2003338460 A | 11/2003 |
| JP | 2003347192 A | 12/2003 |
| JP | 2004088071 A | 3/2004 |
| JP | 2004134447 A | 4/2004 |
| JP | 2004170410 A | 6/2004 |
| JP | 2004273526 A | 9/2004 |
| JP | 2004304031 A | 10/2004 |
| JP | 2004356440 A | 12/2004 |
| JP | 2005079111 A | 3/2005 |
| JP | 2006032814 A | 2/2006 |
| JP | 2006100336 A | 4/2006 |
| JP | 2007041090 A | 2/2007 |
| JP | 2007305880 A | 11/2007 |
| JP | 2008066441 A | 3/2008 |
| JP | 2008096486 A | 4/2008 |
| JP | 2009147254 A | 7/2009 |
| JP | 2011040716 A | 2/2011 |
| TW | 495834 B | 7/2002 |
| TW | I222100 B | 10/2004 |
| TW | I233149 B | 5/2005 |
| TW | 200604763 A | 2/2006 |
| TW | 200700932 | 1/2007 |
| WO | 03036386 | 5/2003 |
| WO | 2008064155 A | 5/2008 |
| WO | 2010025031 A2 | 3/2010 |
| WO | 2010025032 A | 3/2010 |
| WO | 2011025795 A1 | 3/2011 |

OTHER PUBLICATIONS

Notice of Allowance and Fees dated Nov. 25, 2013 for U.S. Appl. No. 13/168,953.
Office Action dated Feb. 14, 2014 for U.S. Appl. No. 13/631,941.
International Search Report and Written Opinion dated Apr. 27, 2012 for PCT Application No. PCT/US2011/055535.
International Search Report and Written Opinion dated Apr. 30, 2012 for PCT Application No. PCT/US2011/055536.
International Search Report and Written Opinion dated Dec. 20, 2012 for PCT Application No. PCT/US2012/054526.
International Search Report and Written Opinion dated Sep. 13, 2012 for PCT Patent Application No. PCT/US2012/043042.
Notice of Allowance and Fees due dated Mar. 6, 2013 for U.S. Appl. No. 13/168,954.

(56) References Cited

OTHER PUBLICATIONS

Office Action dated Dec. 24, 2012 for U.S. Appl. No. 13/168,954.
Office Action dated Jul. 10, 2012 for U.S. Appl. No. 13/168,954.
Office Action dated May 9, 2013 for U.S. Appl. No. 13/269,618.
International Search Report and Written Opinion dated Jul. 24, 2013 for PCT Application No. PCT/US2013/036671.
International Search Report and Written Opinion dated Jul. 29, 2013 for PCT Application No. PCT/US2013/036669.
Notice of Allowance and Fees dated Aug. 21, 2013 for U.S. Appl. No. 13/924,019.
Notice of Allowance and Fees dated Sep. 30, 2013 for U.S. Appl. No. 13/269,618.
Office Action dated Aug. 30, 2013 for U.S. Appl. No. 13/236,610.
Office Action dated Oct. 1, 2013 for U.S. Appl. No. 13/862,475.
Office Action dated May 27, 2014 for Japanese Patent Application No. 2012-535223.
Office Action dated Apr. 15, 2014 for Japanese Patent Application No. 2011-525072.
Office Action dated Apr. 8, 2014 for Japanese Patent Application No. 2011-525091.
Office Action dated Jun. 3, 2014 for Japanese Patent Application No. 2012-526931.
Office Action dated Jun. 10, 2014 for Japanese Patent Application No. 2011-525090.
Office Action dated Jun. 10, 2014 for JP Patent Application No. 2011-525073.
Office Action dated Jun. 3, 2014 for Japanese Patent Application No. 2012-535220.
Office Action dated Jun. 6, 2014 for U.S. Appl. No. 13/329,315.
Office Action dated May 13, 2014 for Japanese Patent Application No. 2010-183857.
Office Action dated May 16, 2014 for U.S. Appl. No. 13/948,725.
Notice of Allowance and Fees dated Aug. 1, 2014 for U.S. Appl. No. 14/108,135.
Notice of Allowance and Fees dated Aug. 15, 2014 for U.S. Appl. No. 13/959,530.
Notice of Allowance and Fees dated Jul. 23, 2014 for U.S. Appl. No. 13/970,465.
Office Action dated Jul. 15, 2014 for U.S. Appl. No. 13/037,270.
Office Action dated Jul. 8, 2014 for Japanese Patent Application No. 2009-200191.
Office Action dated Aug. 5, 2014 for Japanese Patent Application No. 2012-525091.
Office Action dated Oct. 6, 2014 for U.S. Appl. No. 14/331,008.
Official Letter and Search Report dated Aug. 21, 2014 for Taiwanese Patent Application No. 098128359.
Official letter and search report dated Aug. 6, 2014 for Taiwanese Patent Application No. 099127553.
Notice of Allowance and Fees dated Mar. 20, 2014 for U.S. Appl. No. 13/970,465.
Office Action dated Apr. 3, 2014 for Chinese patent application No. 200980134188.6.
Office Action dated Feb. 27, 2014 for U.S. Appl. No. 13/236,610.
Office Action dated Mar. 11, 2014 for U.S. Appl. No. 13/959,530.
Office Action dated May 9, 2014 for U.S. Appl. No. 14/106,584.
Office Action dated May 1, 2014 for U.S. Appl. No. 13/862,471.
Office Action dated May 5, 2014 for U.S. Appl. No. 13/862,475.
Search Report dated Apr. 9, 2014 for Taiwanese Application No. 98128358.
Final Office Action dated Nov. 11, 2014 for Japanese Patent Application No. 2012-526931.
Final Office Action dated Oct. 24, 2014 for U.S. Appl. No. 14/106,584.
Nonfinal Office Action dated Oct. 20, 2014 for U.S. Appl. No. 13/862,471.
Notice of Allowance dated Oct. 10, 2014 for U.S. Appl. No. 13/801,554.
Official Letter and Search Report dated Oct. 24, 2014 for Taiwanese Patent Application No. 099134187.
Official Letter and Search Report dated Sep. 25, 2014 for Taiwanese Patent Application No. 98128360.
Official Letter and Search Report dated Sep. 25, 2014 for Taiwanese Patent Application No. 99134186.
Notice of Allowance and Fees dated Mar. 27, 2015 for U.S. Appl. No. 13/948,725.
Office Action dated Mar. 27, 2015 for U.S. Appl. No. 14/454,140.

* cited by examiner

METHOD AND SYSTEM FOR CRITICAL DIMENSION UNIFORMITY USING CHARGED PARTICLE BEAM LITHOGRAPHY

RELATED APPLICATIONS

This application claims priority from U.S. Provisional Patent Application No. 61/625,932 filed on Apr. 18, 2012, entitled "Method And System For Improving Critical Dimension Uniformity Using Variable Shaped Beam Lithography"; and is related to 1) U.S. patent application Ser. No. 13/862,471 filed on Apr. 15, 2013 and entitled "Method and System For Forming Patterns Using Charged Particle Beam Lithography"; 2) U.S. patent application Ser. No. 13/862,472 filed on Apr. 15, 2013 and entitled "Method and System For Forming Patterns Using Charged Particle Beam Lithography", and issued as U.S. Pat. No. 8,719,739; 3) U.S. patent application Ser. No. 13/862,475 filed on Apr. 15, 2013 and entitled "Method and System For Forming Patterns Using Charged Particle Beam Lithography"; and 4) U.S. Patent Publication No. 2013/0070222 published on Mar. 21, 2013, entitled "Method And System For Optimization Of An Image On A Substrate To Be Manufactured Using Optical Lithography"; all of which are hereby incorporated by reference for all purposes.

BACKGROUND OF THE DISCLOSURE

In the production or manufacturing of semiconductor devices, such as integrated circuits, optical lithography may be used to fabricate the semiconductor devices. Optical lithography is a printing process in which a lithographic mask or photomask manufactured from a reticle is used to transfer patterns to a substrate such as a semiconductor or silicon wafer to create the integrated circuit (I.C.). Other substrates could include flat panel displays, holographic masks or even other reticles. While conventional optical lithography uses a light source having a wavelength of 193 nm, extreme ultraviolet (EUV) or X-ray lithography are also considered types of optical lithography in this application. The reticle or multiple reticles may contain a circuit pattern corresponding to an individual layer of the integrated circuit, and this pattern can be imaged onto a certain area on the substrate that has been coated with a layer of radiation-sensitive material known as photoresist or resist. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Eventually, a combination of multiples of devices or integrated circuits will be present on the substrate. These integrated circuits may then be separated from one another by dicing or sawing and then may be mounted into individual packages. In the more general case, the patterns on the substrate may be used to define artifacts such as display pixels, holograms, directed self-assembly (DSA) guard bands, or magnetic recording heads. Conventional optical lithography writing machines typically reduce the photomask pattern by a factor of four during the optical lithographic process. Therefore, patterns formed on the reticle or mask must be four times larger than the size of the desired pattern on the substrate or wafer.

In the production or manufacturing of semiconductor devices, such as integrated circuits, non-optical methods may be used to transfer a pattern on a lithographic mask to a substrate such as a silicon wafer. Nanoimprint lithography (NIL) is an example of a non-optical lithography process. In nanoimprint lithography, a lithographic mask pattern is transferred to a surface through contact of the lithography mask with the surface.

Two common types of charged particle beam lithography are variable shaped beam (VSB) and character projection (CP). These are both sub-categories of shaped beam charged particle beam lithography, in which a precise electron beam is shaped and steered so as to expose a resist-coated surface, such as the surface of a wafer or the surface of a reticle. In VSB, these shapes are simple shapes, usually limited to rectangles of certain minimum and maximum sizes and with sides which are parallel to the axes of a Cartesian coordinate plane (i.e. of "manhattan" orientation), and 45 degree right triangles (i.e. triangles with their three internal angles being 45 degrees, 45 degrees, and 90 degrees) of certain minimum and maximum sizes. At predetermined locations, doses of electrons are shot into the resist with these simple shapes. The total writing time for this type of system increases with the number of shots. In character projection (CP), there is a stencil in the system that has in it a variety of apertures or characters which may be complex shapes such as rectilinear, arbitrary-angled linear, circular, nearly circular, annular, nearly annular, oval, nearly oval, partially circular, partially nearly circular, partially annular, partially nearly annular, partially nearly oval, or arbitrary curvilinear shapes, and which may be a connected set of complex shapes or a group of disjointed sets of a connected set of complex shapes. An electron beam can be shot through a character on the stencil to efficiently produce more complex patterns on the reticle. In theory, such a system can be faster than a VSB system because it can shoot more complex shapes with each time-consuming shot. Thus, an E-shaped pattern shot with a VSB system takes four shots, but the same E-shaped pattern can be shot with one shot with a character projection system. Note that VSB systems can be thought of as a special (simple) case of character projection, where the characters are just simple characters, usually rectangles or 45-45-90 degree triangles. It is also possible to partially expose a character. This can be done by, for instance, blocking part of the particle beam. For example, the E-shaped pattern described above can be partially exposed as an F-shaped pattern or an I-shaped pattern, where different parts of the beam are cut off by an aperture. This is the same mechanism as how various sized rectangles can be shot using VSB. In this disclosure, partial projection is used to mean both character projection and VSB projection. Shaped beam charged particle beam lithography may use either a single shaped beam, or may use a plurality of shaped beams simultaneously exposing the surface, the plurality of shaped beams producing a higher writing speed than a single shaped beam.

As indicated, in lithography the lithographic mask or reticle comprises geometric patterns corresponding to the circuit components to be integrated onto a substrate. The patterns used to manufacture the reticle may be generated utilizing computer-aided design (CAD) software or programs. In designing the patterns the CAD program may follow a set of pre-determined design rules in order to create the reticle. These rules are set by processing, design, and end-use limitations. An example of an end-use limitation is defining the geometry of a transistor in a way in which it cannot sufficiently operate at the required supply voltage. In particular, design rules can define the space tolerance between circuit devices or interconnect lines. The design rules are, for example, used to ensure that the circuit devices or lines do not interact with one another in an undesirable manner. For example, the design rules are used so that lines do not get too close to each other in a way that may cause a short circuit. The design rule limitations reflect, among other things, the smallest dimensions that can be reliably fabricated. When referring to these small dimensions, one usually introduces the concept of a critical dimension. These are, for instance, defined as the smallest width of a line or the smallest space between two lines, those dimensions requiring exquisite control.

One goal in integrated circuit fabrication by optical lithography is to reproduce the original circuit design on the substrate by use of the reticle. Integrated circuit fabricators are always attempting to use the semiconductor wafer real estate as efficiently as possible. Engineers keep shrinking the size of the circuits to allow the integrated circuits to contain more circuit elements and to use less power. As the size of an integrated circuit critical dimension is reduced and its circuit density increases, the critical dimension of the circuit pattern or physical design approaches the resolution limit of the optical exposure tool used in conventional optical lithography. As the critical dimensions of the circuit pattern become smaller and approach the resolution value of the exposure tool, the accurate transcription of the physical design to the actual circuit pattern developed on the resist layer becomes difficult. To further the use of optical lithography to transfer patterns having features that are smaller than the light wavelength used in the optical lithography process, a process known as optical proximity correction (OPC) has been developed. OPC alters the physical design to compensate for distortions caused by effects such as optical diffraction and the optical interaction of features with proximate features. OPC includes all resolution enhancement technologies performed with a reticle.

OPC may add sub-resolution lithographic features to mask patterns to reduce differences between the original physical design pattern, that is, the design, and the final transferred circuit pattern on the substrate. The sub-resolution lithographic features interact with the original patterns in the physical design and with each other and compensate for proximity effects to improve the final transferred circuit pattern. One feature that is used to improve the transfer of the pattern is a sub-resolution assist feature (SRAF). Another feature that is added to improve pattern transference is referred to as "serifs". Serifs are small features that can be positioned on an interior or exterior corner of a pattern to sharpen the corner in the final transferred image. It is often the case that the precision demanded of the surface manufacturing process for SRAFs is less than the precision demanded for patterns that are intended to print on the substrate, often referred to as main features. Serifs are a part of a main feature. As the limits of optical lithography are being extended far into the sub-wavelength regime, the OPC features must be made more and more complex in order to compensate for even more subtle interactions and effects. As imaging systems are pushed closer to their limits, the ability to produce reticles with sufficiently fine OPC features becomes critical. Although adding serifs or other OPC features to a mask pattern is advantageous, it also substantially increases the total feature count in the mask pattern. For example, adding a serif to each of the corners of a square using conventional techniques adds eight more rectangles to a mask or reticle pattern. Adding OPC features is a very laborious task, requires costly computation time, and results in more expensive reticles. Not only are OPC patterns complex, but since optical proximity effects are long range compared to minimum line and space dimensions, the correct OPC patterns in a given location depend significantly on what other geometry is in the neighborhood. Thus, for instance, a line end will have different size serifs depending on what is near it on the reticle. This is even though the objective might be to produce exactly the same shape on the wafer. These slight but critical variations are important and have prevented others from being able to form reticle patterns. It is conventional to discuss the OPC-decorated patterns to be written on a reticle in terms of designed features, that is features that reflect the design before OPC decoration, and OPC features, where OPC features might include serifs, jogs, and SRAF. To quantify what is meant by slight variations, a typical slight variation in OPC decoration from neighborhood to neighborhood might be 5% to 80% of a designed feature size. Note that for clarity, variations in the design of the OPC are what is being referenced. Manufacturing variations, such as line-edge roughness and corner rounding, will also be present in the actual surface patterns. When these OPC variations produce substantially the same patterns on the wafer, what is meant is that the geometry on the wafer is targeted to be the same within a specified error, which depends on the details of the function that that geometry is designed to perform, e.g., a transistor or a wire. Nevertheless, typical specifications are in the 2%-50% of a designed feature range. There are numerous manufacturing factors that also cause variations, but the OPC component of that overall error is often in the range listed. OPC shapes such as sub-resolution assist features are subject to various design rules, such as a rule based on the size of the smallest feature that can be transferred to the wafer using optical lithography. Other design rules may come from the mask manufacturing process or, if a character projection charged particle beam writing system is used to form the pattern on a reticle, from the stencil manufacturing process. It should also be noted that the accuracy requirement of the SRAF features on the mask may be lower than the accuracy requirements for the designed features on the mask. As process nodes continue to shrink, the size of the smallest SRAFs on a photomask also shrinks For example, at the 20 nm logic process node, 40 nm to 60 nm SRAFs are needed on the mask for the highest precision layers.

Inverse lithography technology (ILT) is one type of OPC technique. ILT is a process in which a pattern to be formed on a reticle is directly computed from a pattern which is desired to be formed on a substrate such as a silicon wafer. This may include simulating the optical lithography process in the reverse direction, using the desired pattern on the substrate as input. ILT-computed reticle patterns may be purely curvilinear—i.e. completely non-rectilinear—and may include circular, nearly circular, annular, nearly annular, oval and/or nearly oval patterns. Since these ideal ILT curvilinear patterns are difficult and expensive to form on a reticle using conventional techniques, rectilinear approximations or rectilinearizations of the ideal curvilinear patterns may be used. The rectilinear approximations decrease accuracy, however, compared to the ideal ILT curvilinear patterns. Additionally, if the rectilinear approximations are produced from the ideal ILT curvilinear patterns, the overall calculation time is increased compared to ideal ILT curvilinear patterns. In this disclosure ILT, OPC, source mask optimization (SMO), and computational lithography are terms that are used interchangeably.

In EUV lithography, OPC features are generally not required. Therefore, the complexity of the pattern to be manufactured on the reticle is less than with conventional 193 nm wavelength optical lithography, and shot count reduction is correspondingly less important. In EUV, however, mask accuracy requirements are very high because the patterns on the mask, which are typically 4× the size of the patterns on the wafer, are sufficiently small that they are challenging to form precisely using charged particle beam technology such as electron beam.

There are a number of technologies used for forming patterns on a reticle, including using optical lithography or charged particle beam lithography. The most commonly used system is the variable shaped beam (VSB), where, as described above, doses of electrons with simple shapes such as manhattan rectangles and 45-degree right triangles expose a resist-coated reticle surface. In conventional mask writing, the doses or shots of electrons are designed to avoid overlap wherever possible, so as to greatly simplify calculation of how the resist on the reticle will register the pattern. Similarly, the set of shots is designed so as to completely cover the pattern area that is to be formed on the reticle. U.S. Pat. No. 7,754,401, owned by the assignee of the present patent application and incorporated by reference for all purposes, discloses a method of mask writing in which intentional shot overlap for writing patterns is used. When overlapping shots are used, charged particle beam simulation can be used to determine the pattern that the resist on the reticle will register. Use of overlapping shots may allow patterns to be written with reduced shot count. U.S. Pat. No. 7,754,401 also discloses use of dose modulation, where the assigned dosages of shots vary with respect to the dosages of other shots. The term model-based fracturing is used to describe the process of determining shots using the techniques of U.S. Pat. No. 7,754,401.

Reticle writing for the most advanced technology nodes typically involves multiple passes of charged particle beam writing, a process called multi-pass exposure, whereby the given shape on the reticle is written and overwritten. Typically, two to four passes are used to write a reticle to average out precision errors in the charged particle beam writer, allowing the creation of more accurate photomasks. Also typically, the list of shots, including the dosages, is the same for every pass. In one variation of multi-pass exposure, the lists of shots may vary among exposure passes, but the union of the shots in any exposure pass covers the same area. Multi-pass writing can reduce over-heating of the resist coating the surface. Multi-pass writing also averages out random errors of the charged particle beam writer. Multi-pass writing using different shot lists for different exposure passes can also reduce the effects of certain systemic errors in the writing process.

SUMMARY OF THE DISCLOSURE

A method for mask data preparation (MDP) or mask process correction (MPC) is disclosed in which a set of charged particle beam shots is determined which is capable of forming a pattern on a surface, wherein critical dimension uniformity (CDU) of the pattern is optimized by varying at least two factors, such as dose margin, critical dimension split (CD split) reduction, or sliver reduction.

A method for mask data preparation (MDP) or mask process correction (MPC) is disclosed in which a set of charged particle beam shots is determined which is capable of forming a pattern on a surface, wherein critical dimension uniformity (CDU) is maintained while reducing shot count, and where model-based techniques are used.

A method for mask data preparation (MDP) or mask process correction (MPC) is disclosed wherein shots in an inputted shot list are modified so as to improve the critical dimension uniformity (CDU) of a pattern that the shots are capable of forming, where at least two factors are varied.

A method for mask data preparation (MDP) or mask process correction (MPC) is disclosed in which a set of charged particle beam shots is determined which is capable of forming a pattern on a surface, wherein critical dimension uniformity (CDU) of the pattern is optimized, and wherein the optimization uses model-based techniques.

A method for mask data preparation (MDP) or mask process correction (MPC) is disclosed wherein shots in an inputted shot list are modified so as to improve the critical dimension uniformity (CDU) of a pattern that the shots are capable of forming, wherein the modification uses model-based techniques.

A method for mask data preparation (MDP) or mask process correction (MPC) is disclosed in which a set of charged particle beam shots is determined which is capable of forming a pattern on a reticle, where the reticle is capable of being used in an optical lithographic process to form a substrate pattern on a substrate, where the substrate pattern has wafer critical dimensions, where wafer critical dimension uniformity (CDU) is optimized, and where the optimization uses model-based techniques.

DETAILED DESCRIPTION OF THE EMBODIMENTS

The present disclosure is related to lithography, and more particularly to the design and manufacture of a surface which may be a reticle, a wafer, or any other surface, using charged particle beam lithography.

Figure 1:
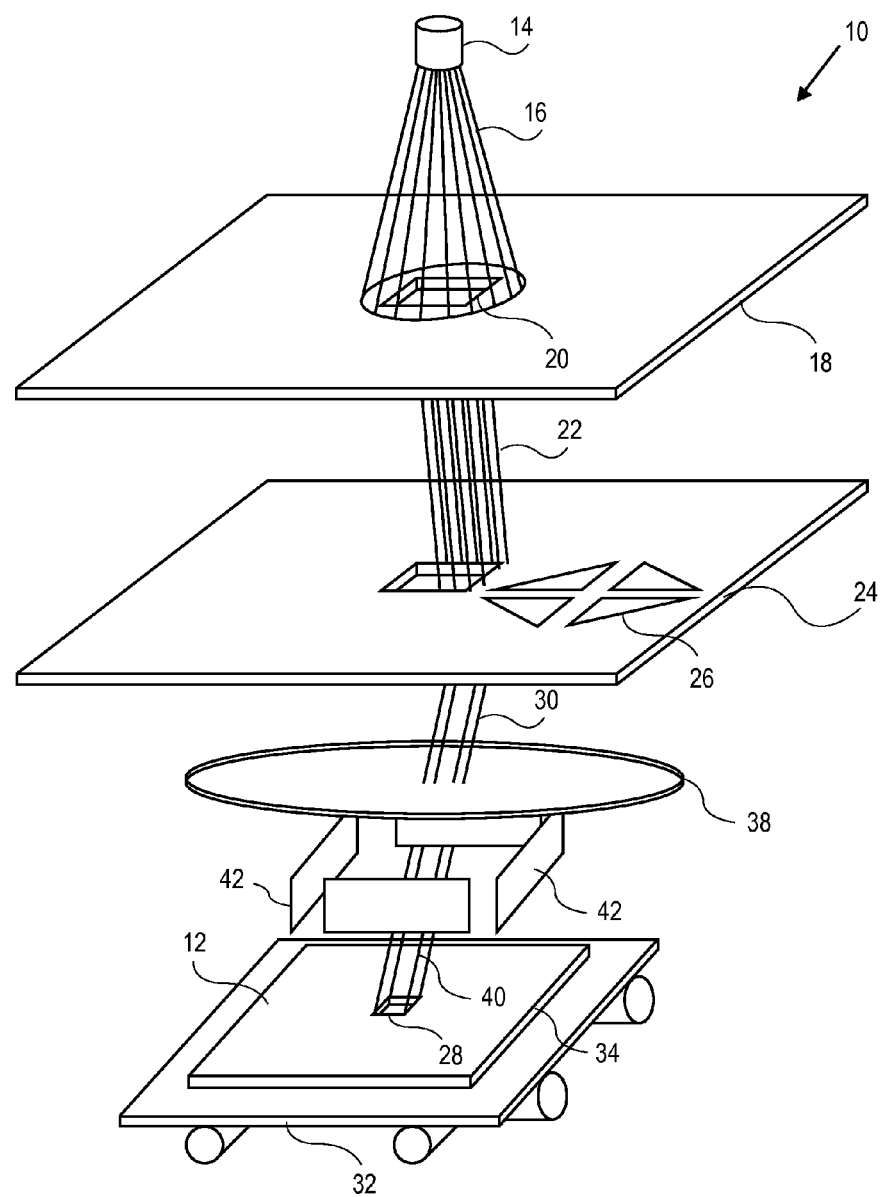
FIG. 1 illustrates an example of a variable shaped beam (VSB) charged particle beam system.

Referring now to the drawings, wherein like numbers refer to like items, FIG. 1 illustrates an embodiment of a lithography system, such as a charged particle beam writer system, in this case an electron beam writer system 10, that employs a variable shaped beam (VSB) to manufacture a surface 12. The electron beam writer system 10 has an electron beam source 14 that projects an electron beam 16 toward an aperture plate 18. The plate 18 has an aperture 20 formed therein which allows the electron beam 16 to pass. Once the electron beam 16 passes through the aperture 20 it is directed or deflected by a system of lenses (not shown) as electron beam 22 toward another rectangular aperture plate or stencil mask 24. The stencil 24 has formed therein a number of openings or apertures 26 that define various simple shapes such as rectangles and triangles. Each aperture 26 formed in the stencil 24 may be used to form a pattern in the surface 12 of a substrate 34, such as a silicon wafer, a reticle or other substrate. An electron beam 30 emerges from one of the apertures 26 and passes through an electromagnetic or electrostatic reduction lens 38, which reduces the size of the pattern emerging from the aperture 26. In commonly available charged particle beam writer systems, the reduction factor is between 10 and 60. The reduced electron beam 40 emerges from the reduction lens 38 and is directed by a series of deflectors 42 onto the surface 12 as a pattern 28. The surface 12 is coated with resist (not shown) which reacts with the electron beam 40. The electron beam 22 may be directed to overlap a variable portion of an aperture 26, affecting the size and shape of the pattern 28. Blanking plates (not shown) are used to deflect the beam 16 or the shaped beam 22 so to prevent the electron beam from reaching the surface 12 during a period after each shot when the lenses directing the beam 22 and the deflectors 42 are being re-adjusted for the succeeding shot. Typically the blanking plates are positioned so as to deflect the electron beam 16 to prevent it from illuminating aperture 20. The blanking period may be a fixed length of time, or it may vary depending, for example, on how much the deflector 42 must be re-adjusted for the position of the succeeding shot.

In electron beam writer system 10, the substrate 34 is mounted on a movable platform 32. The platform 32 allows substrate 34 to be repositioned so that patterns which are larger than the maximum deflection capability or field size of the charged particle beam 40 may be written to surface 12 in a series of subfields, where each subfield is within the capability of deflector 42 to deflect the beam 40. In one embodiment the substrate 34 may be a reticle. In this embodiment, the reticle, after being exposed with the pattern, undergoes various manufacturing steps through which it becomes a lithographic mask or photomask. The mask may then be used in an optical lithography machine to project an image of the reticle pattern 28, generally reduced in size, onto a silicon wafer to produce an integrated circuit. More generally, the mask is used in another device or machine to transfer the pattern 28 on to a substrate (not illustrated).

Although FIG. 1 illustrates a charged particle beam system in which a single beam 40 illuminates the surface 12, some charged particle beam writers can simultaneously illuminate a surface with a plurality of beams, which may or may not be independently adjustable and positionable. Multi-beam charged particle beam writers generally have higher writing speeds than single-beam writers. Some types of multi-beam writers are shaped beam, while in others the beams are scanned across the surface. For the purposes of this disclosure, the term "shot" includes exposure information for both shaped beam and scanned beam multi-beam writers, as well as for shaped single-beam writers.

The minimum size pattern that can be projected with reasonable accuracy onto a surface 12 is limited by a variety of short-range physical effects associated with the electron beam writer system 10 and with the surface 12, which normally comprises a resist coating on the substrate 34. These effects include forward scattering, Coulomb effect, and resist diffusion. Beam blur, also called $\beta_f$, is a term used to include all of these short-range effects. The most modern electron beam writer systems can achieve an effective beam blur radius or $\beta_f$ in the range of 20 nm to 30 nm. Forward scattering may constitute one quarter to one half of the total beam blur. Modern electron beam writer systems contain numerous mechanisms to reduce each of the constituent pieces of beam blur to a minimum. Since some components of beam blur are a function of the calibration level of a particle beam writer, the $\beta_f$ of two particle beam writers of the same design may differ. The diffusion characteristics of resists may also vary. Variation of $\beta_f$ based on shot size or shot dose can be simulated and systemically accounted for. But there are other effects that cannot or are not accounted for, and they appear as random variation.

The shot dosage of a charged particle beam writer such as an electron beam writer system is a function of the intensity of the beam source 14 and the exposure time for each shot. Typically the beam intensity remains nominally fixed, and the exposure time is varied to obtain variable shot dosages. The exposure time may be varied to compensate for various long-range effects such as back scatter, fogging and loading effects in a process called proximity effect correction (PEC). Electron beam writer systems usually allow setting an overall dosage, called a base dosage, which affects all shots in an exposure pass. Some electron beam writer systems perform dosage compensation calculations within the electron beam writer system itself, and do not allow the dosage of each shot to be assigned individually as part of the input shot list, the input shots therefore having unassigned shot dosages. In such electron beam writer systems all shots implicitly have the base dosage, before PEC. Other electron beam writer systems do allow explicit dosage assignment on a shot-by-shot basis. In electron beam writer systems that allow shot-by-shot dosage assignment, the number of available dosage levels may be 64 to 4096 or more, or there may be a relatively few available dosage levels, such as 3 to 8 levels. For scanned multi-beam systems, dosage adjustment may be done by scanning the surface multiple times.

Conventionally, shots are designed so as to completely cover an input pattern with rectangular shots, while avoiding shot overlap wherever possible. Also, all shots are designed to have a normal dosage, which is a dosage at which a relatively large rectangular shot, in the absence of long-range effects, will produce a pattern on the surface which is the same size as is the shot size. Some electron beam writer systems enforce this methodology by not allowing shots to overlap within an exposure pass.

In exposing, for example, a repeated pattern on a surface using charged particle beam lithography, the size of each pattern instance, as measured on the final manufactured surface, will be slightly different, due to manufacturing variations. The amount of the size variation is an essential manufacturing optimization criterion. In current mask masking, a root mean square (RMS) variation of no more than 1 nm (1 sigma) in pattern size may be desired. More size variation translates to more variation in circuit performance, leading to higher design margins being required, making it increasingly difficult to design faster, lower-power integrated circuits. This variation is referred to as critical dimension (CD) variation. A low CD variation is desirable, and indicates that manufacturing variations will produce relatively small size variations on the final manufactured surface. In the smaller scale, the effects of a high CD variation may be observed as line edge roughness (LER). LER is caused by each part of a line edge being slightly differently manufactured, leading to some waviness in a line that is intended to have a straight edge. CD variation is, among other things, inversely related to the slope of the dosage curve at the resist threshold, which is called edge slope. Therefore, edge slope, or dose margin, is a critical optimization factor for particle beam writing of surfaces. In this disclosure, edge slope and dose margin are terms that are used interchangeably.

With conventional fracturing, without shot overlap, gaps or dose modulation, the dose margin of the written shapes is considered immutable: that is, there is no opportunity to improve dose margin by a choice of fracturing options. In modern practice, the avoidance of very narrow shots called slivers is an example of a practical rule-based method that helps to optimize the shot list for dose margin.

In a fracturing environment where overlapping shots and dose-modulated shots can be generated, there is both a need and an opportunity to optimize for dose margin. The additional flexibility in shot combinations allowed by use of shot overlap and dose modulation allows generation of fracturing solutions that appear to generate the target mask shapes on the surface, but may do so only under perfect manufacturing conditions. The use of overlapping shots and dose-modulated shots therefore creates incentive to address the issue of dose margin and its improvement.

Figure 2A:
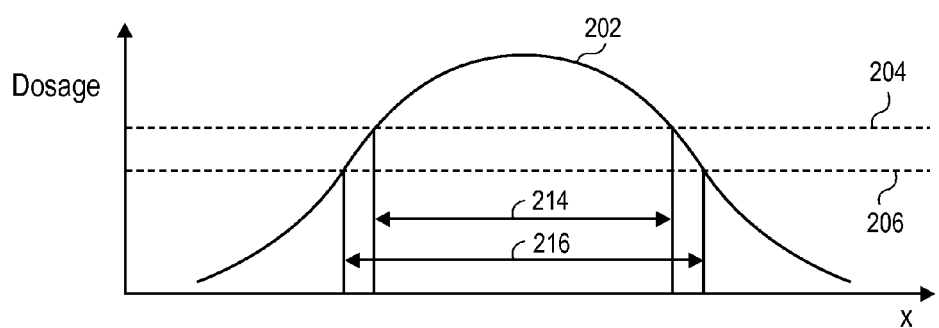
FIG. 2A illustrates an example of a cross-sectional dosage graph, showing registered pattern widths for each of two resist thresholds.
Figure 2B:
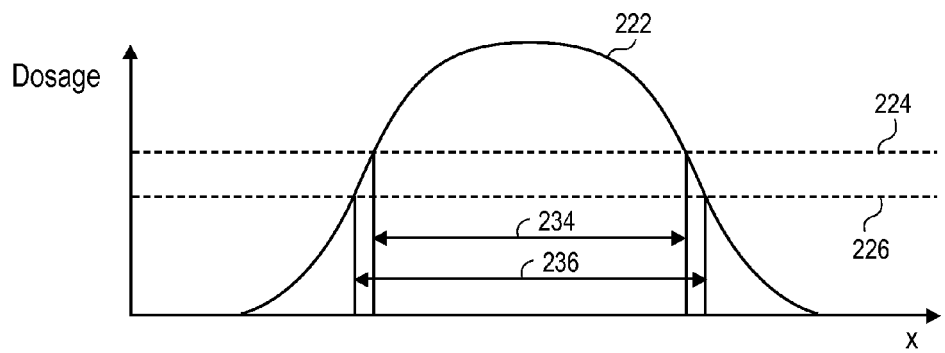
FIG. 2B illustrates an example of a cross-sectional dosage graph similar to FIG. 2A, but with a higher dosage edge slope than in FIG. 2A.

FIGS. 2A-B illustrate how critical dimension variation can be reduced by exposing the pattern on the resist so as to produce a relatively high edge slope in the exposure or dosage curve, such as is described in U.S. Patent Publication No. 2012/0096412 published on Apr. 19, 2012, entitled "Method and System for Forming High Accuracy Patterns Using Charged Particle Beam Lithography," which is hereby incorporated by reference for all purposes. FIG. 2A illustrates a cross-sectional dosage curve 202, where the x-axis shows the cross-sectional distance through an exposed pattern—such as the distance perpendicular to two of the pattern's edges—and the y-axis shows the dosage received by the resist. A pattern is registered by the resist where the received dosage is higher than a threshold. Two thresholds are illustrated in FIG. 2A, illustrating the effect of a variation in resist sensitivity. The higher threshold 204 causes a pattern of width 214 to be registered by the resist. The lower threshold 206 causes a pattern of width 216 to be registered by the resist, where width 216 is greater than width 214. FIG. 2B illustrates another cross-sectional dosage curve 222. Two thresholds are illustrated, where threshold 224 is the same as threshold 204 of FIG. 2A, and threshold 226 is the same as threshold 206 of FIG. 2A. The slope of dosage curve 222 is higher in the vicinity of the two thresholds than is the slope of dosage curve 202. For dosage curve 222, the higher threshold 224 causes a pattern of width 234 to be registered by the resist. The lower threshold 226 causes a pattern of width 236 to be registered by the resist. As can be seen, the difference between width 236 and width 234 is less than the difference between width 216 and width 214, due to the higher edge slope of dosage curve 222 compared to dosage curve 202. If the resist-coated surface is a reticle, then the lower sensitivity of curve 222 to variation in resist threshold can cause the pattern width on a photomask manufactured from the reticle to be closer to the target pattern width for the photomask, thereby increasing the yield of usable integrated circuits when the photomask is used to transfer a pattern to a substrate such as a silicon wafer. Similar improvement in tolerance to variation in dose for each shot is observed for dose curves with higher edge slopes. Achieving a relatively higher edge slope such as in dosage curve 222 is therefore desirable.

As described above, process variations can cause the width of a pattern on a photomask to vary from the intended or target width. The pattern width variation on the photomask will cause a pattern width variation on a wafer which has been exposed using the photomask in an optical lithographic process. The sensitivity of the wafer pattern width to variations in photomask pattern width is called mask edge error factor, or MEEF. In an optical lithography system using a 4× photomask, where the optical lithographic process projects a 4× reduced version of the photomask pattern onto the wafer, a MEEF of 1, for example, means that for each 1 nm error in pattern width on a photomask, the pattern width on the wafer will change by 0.25 nm. A MEEF of 2 means that for a 1 nm error in photomask pattern width, the pattern width on the wafer will change by 0.5 nm. For the smallest integrated circuits processes, MEEF may be greater than 2.

Figure 3A:
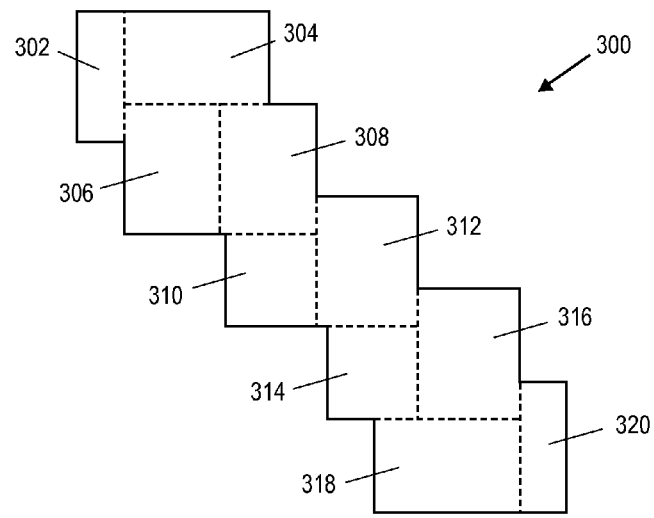
FIG. 3A illustrates an example of a set of shots which can form a diagonal path or track.
Figure 3B:
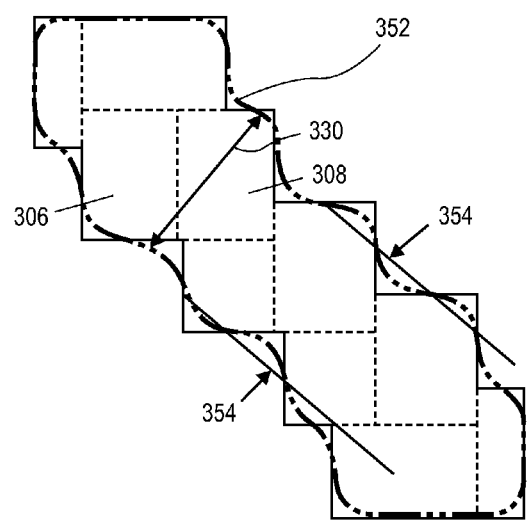
FIG. 3B illustrates an example of a pattern which may be formed on a surface using the set of shots from FIG. 3A.

FIG. 3A illustrates an example of a set of conventional non-overlapping VSB shots 300 that will form a diagonal path or track. The set of shots 300 consists of shot 302, shot 304, shot 306, shot 308, shot 310, shot 312, shot 314, shot 316, shot 318, and shot 320. The shots abut but do not overlap neighboring shots. FIG. 3B illustrates a pattern 352 that the set of shots 300 may form on a surface. Pattern 352 is illustrated as a heavy broken line. Charged particle beam simulation may be used to calculate path 352 from set of shots 300. As can be seen, pattern 352 exhibits corner rounding. The CD of pattern 352 is its perpendicular width—that is the dimension in the direction perpendicular to the longest dimension of the path. As commonly measured, the CD of a varying width pattern such as pattern 352 is considered to be its average dimension 354. As can be seen, the perpendicular width of path 352 is nowhere determined by a single shot. For example, along line 330 shots 306 and 308 determine the CD, thereby creating a CD split along line 330. Path 352 is therefore subject to the effects of CD split along its entire length.

Figure 4A:
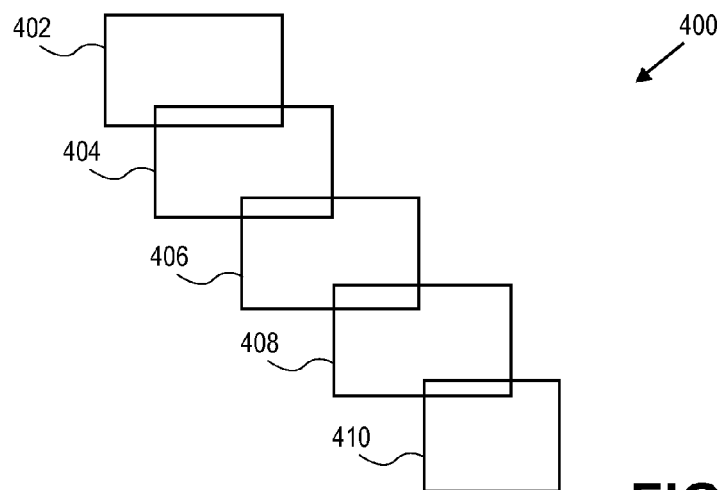
FIG. 4A illustrates an example of a set of overlapping shots which can form a diagonal path or track.
Figure 4B:
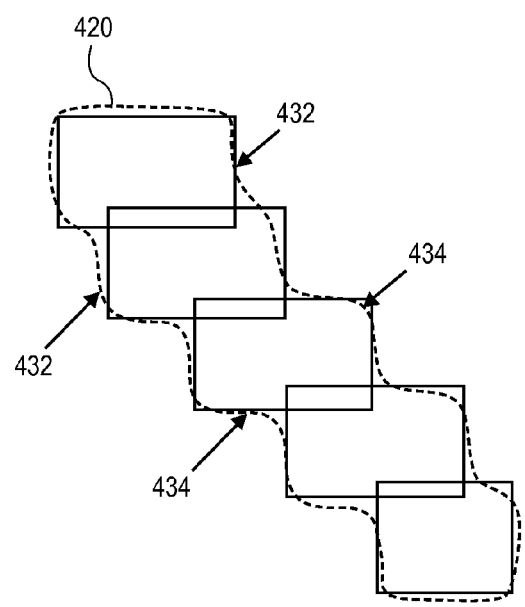
FIG. 4B illustrates an example of a pattern which may be formed on the a surface using the set of shots from FIG. 4A.

FIG. 4A illustrates an example of a set shots 400 which consists of five overlapping VSB shots that will form a linear non-manhattan track on a surface, according to another embodiment of the current disclosure. Set of shots 400 consists of shot 402, shot 404, shot 406, shot 408 and shot 410. For the interior shots in the track—shots 404, 406 and 408, the x-offset and y-offset of nearest-neighboring shots is uniform, creating uniform overlap between neighboring shots. FIG. 4B illustrates the set of shots of FIG. 4A, along with a pattern 420, illustrated with a broken line, which set of shots 400 will form on a surface such as a reticle. The critical dimension 432 of pattern 420 has some CD split, since critical dimension 432 is formed by two shots. The critical dimension 434 has no CD split, since critical dimension 434 is formed by only one shot. With overlapping shots, the shot size and the amount of overlap can be varied to achieve differing amounts of CD split.

Figure 5A:
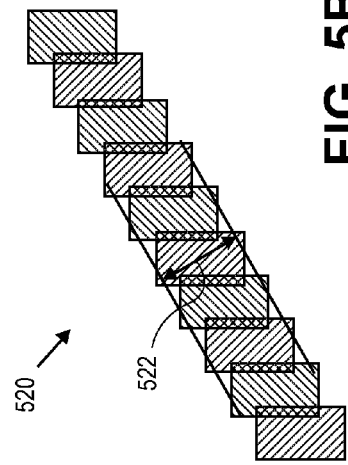
FIG. 5A illustrates an example of a set of non-overlapping VSB shots which can form a diagonal path or track.
Figure 5B:
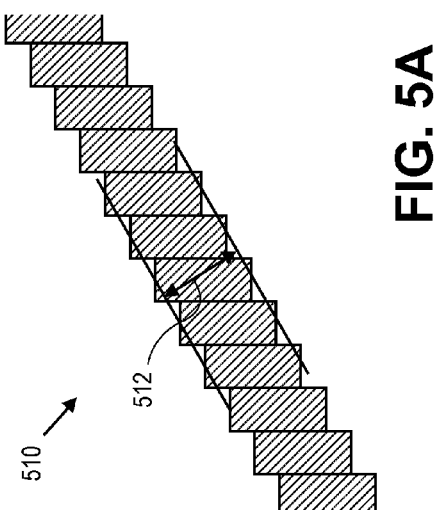
FIG. 5B illustrates an example of a set of overlapping VSB shots which can form a diagonal path or track which is similar to the track of FIG. 5A.

FIGS. 5A-D illustrate four examples of shots that can form a linear non-manhattan track, where the various shot sizes and overlaps produce different pattern characteristics on a surface such as a reticle. In FIGS. 5A-D, the edges of the track are approximately parallel for a majority of the track's length. The tracks may be described by at least one width and an angle. FIG. 5A illustrates a set of shots 510. Line segment 512, which is perpendicular to the direction of the track formed by set of shots 510, is positioned to illustrate that a "peak" on the top of the track corresponds to a "valley" on the bottom of the track. This configuration can produce a track with minimum line width roughness (LWR), but which has a medium CD split. FIG. 5B illustrates another set of shots 520.

Figure 5C:
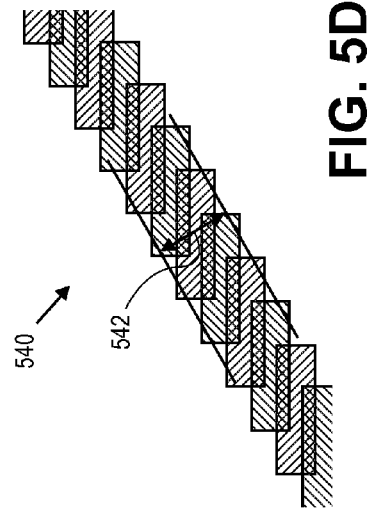
FIG. 5C illustrates another example of a set of overlapping VSB shots which can form a diagonal path or track which is similar to the track of FIG. 5A.
Figure 5D:
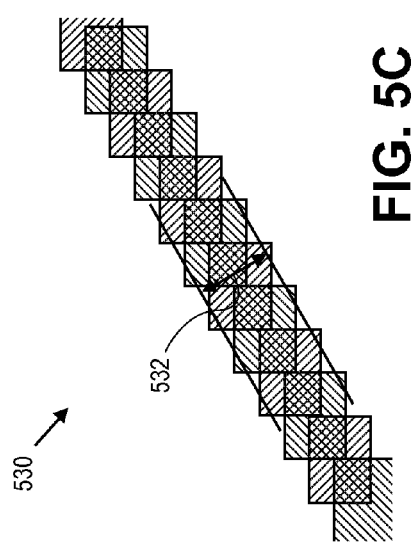
FIG. 5D illustrates another example of a set of overlapping VSB shots which can form a diagonal path or track which is similar to the track of FIG. 5A.

Line segment 522, which is perpendicular to the direction of the track formed by set of shots 520, is positioned to illustrate that opposite edges of the track are formed from a single shot, producing a minimum CD split. Set of shots 520 produces a maximum LWR, however, due to the line widths corresponding to peak-to-peak positionings, such as line segment 522, and valley-to-valley positionings. FIG. 5C illustrates another set of shots 530. Line segment 532 is perpendicular to the direction of the track formed by set of shots 530. Line segment 532 is positioned at a valley on the upper edge of the track formed by set of shots 530, but is near a peak on the bottom edge of the track. Set of shots 530 produces a low LWR, but a medium CD split. FIG. 5D illustrates another set of shots 540. Line segment 542 is perpendicular to the direction of the track formed by set of shots 540. The shot size and shot overlap in set of shots 540 produces maximum CD split, where there is CD split everywhere on the track form by the set of shots. Set of shots 540 produces a medium LWR.

The CDU of a pattern to be formed on a reticle may be more accurately modeled by accounting for the random and systematic variations inherent in the charged particle beam lithography process. In one embodiment, a Monte Carlo method may be used to account for these variations. In this way the CDU of a pattern such as a linear track may be calculated stochastically using Monte Carlo analysis. The CDU of a track may be determined based on a plurality of unique Monte Carlo simulations, where for each simulation, each shot comprising the track is subjected to variation in one or more manufacturing parameters. For each unique Monte Carlo simulation the reticle image from the set of varied shots is calculated. For each calculated reticle image, the pattern CD is measured. The measurement may use a technique similar to that commonly used in making physical scanning electron microscope (SEM) measurements of manufactured patterns on reticles. The resulting aggregate of measurements from the plurality of unique Monte Carlo simulations, with each simulation having a measured CD, comprises a CD distribution. Groups of VSB, CP or combined VSB and CP shots may be analyzed in this way.

Figure 6:
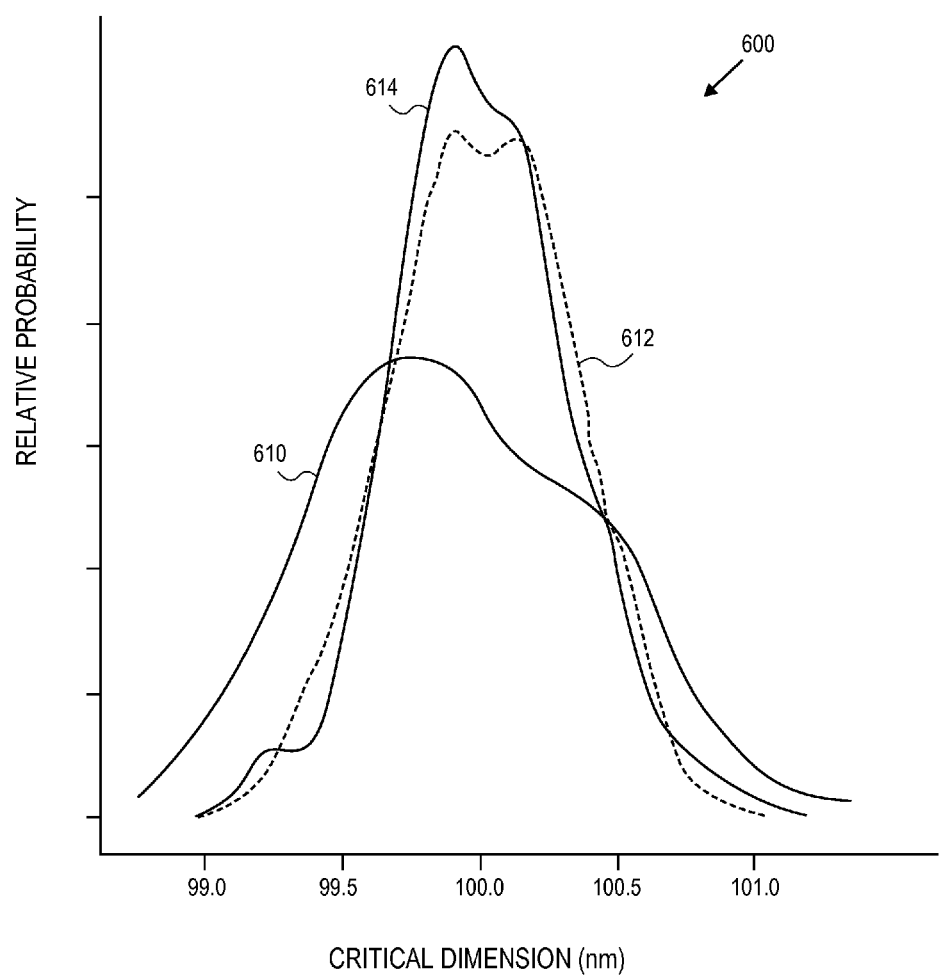
FIG. 6 illustrates a graph of critical dimension (CD) probability for three shot configurations where reticle write time is constant among configurations.

FIG. 6 illustrates an example of a CD distribution graph 600 using a variety of shot configurations that may be used to form a track. In this example the track is a non-manhattan linear track where the track has a nominal design width of 100 nm. Three shot configurations were analyzed:
- Curve 610: Conventional non-overlapping VSB shots, using the conventionally-calculated shot dimensions based on the track's angle and 100 nm width.
- Curve 612: Overlapping VSB shots. A configuration of overlapping VSB shots was determined using model-based techniques, such that the shot configuration can form a track of 100 nm, where the shot-to-shot spacing, and therefore the shot count, was the same as the conventional non-overlapping shot configuration above.
- Curve 614: Overlapping circular character projection shots. A circular shot configuration was determined that can form a track of 100 nm, where the shot-to-shot spacing, and therefore the shot count, was the same as the conventional non-overlapping shot configuration above.

In this experiment, all three shot configurations used the same pre-PEC dosage, before the effects of manufacturing variation were added. In other embodiments, shots with different assigned dosages, with the resultant dose margin variation, are also possible. Additionally, in other embodiments, sliver reduction may be varied. Using Monte Carlo techniques, the effects of manufacturing variation on CDU were then calculated for tracks formed using each shot configuration. Two parameters were varied:
- Shot dosage was varied using a normal distribution, with a sigma of 5% of a normal dosage.
- The position of each shot was varied using a normal distribution, with a sigma of 1.5 nm. For shot configurations in which CD split exists, varying shot position will model the effects of the CD split.

In some embodiments shot size could also be varied, although in the experiment of FIG. 6 it was not. Size variation could include factors such as width, height, or width and height together. FIG. 6 illustrates the results of this experiment in the graph 600 which shows the probability distributions of CDs for a linear non-manhattan track formed using the shot configurations listed above for curves 610, 612 and 614. The x-axis of graph 600 is the CD, where 100.0 nm is the design width. The y-axis of graph 600 is a relative probability. The area under each of the three curves is equal, since the sum of all CD probabilities is unity. The 1-sigma of each CD curve is:
- Curve 610: 0.49 nm
- Curve 612: 0.33 nm
- Curve 614: 0.32 nm Additionally, the LWR of the various shot configurations is:
- Conventional non-overlapping shots (curve 610): 4.13 nm
- Optimized overlapping VSB shots (curve 612): 2.83 nm
- Optimized overlapping circular CP shots (curve 614): 2.70 nm The use of overlapping shots this example illustrates that CDU and LWR may both be improved, compared with conventional shots. Furthermore, use of circular CP shots may provide more improvement than use of VSB shots. Other sets of overlapping VSB shots using the same shot-to-shot spacing may display an even better CDU than CD distribution 612. Similarly, other sets of CP shots using the same shot-to-shot spacing may display an ever better CDU than CD distribution 614.

Similar techniques may be used to calculate the CDU of curvilinear tracks, and to calculate the dimensional variability of more general reticle patterns. Although the term "critical dimension" is commonly applied only to tracks, the similar term "wafer critical dimension" refers to the desired dimensions of arbitrary patterns in a physical design. The techniques set forth for optimizing CDU can also be used to optimize wafer critical dimension uniformity.

Figure 7:
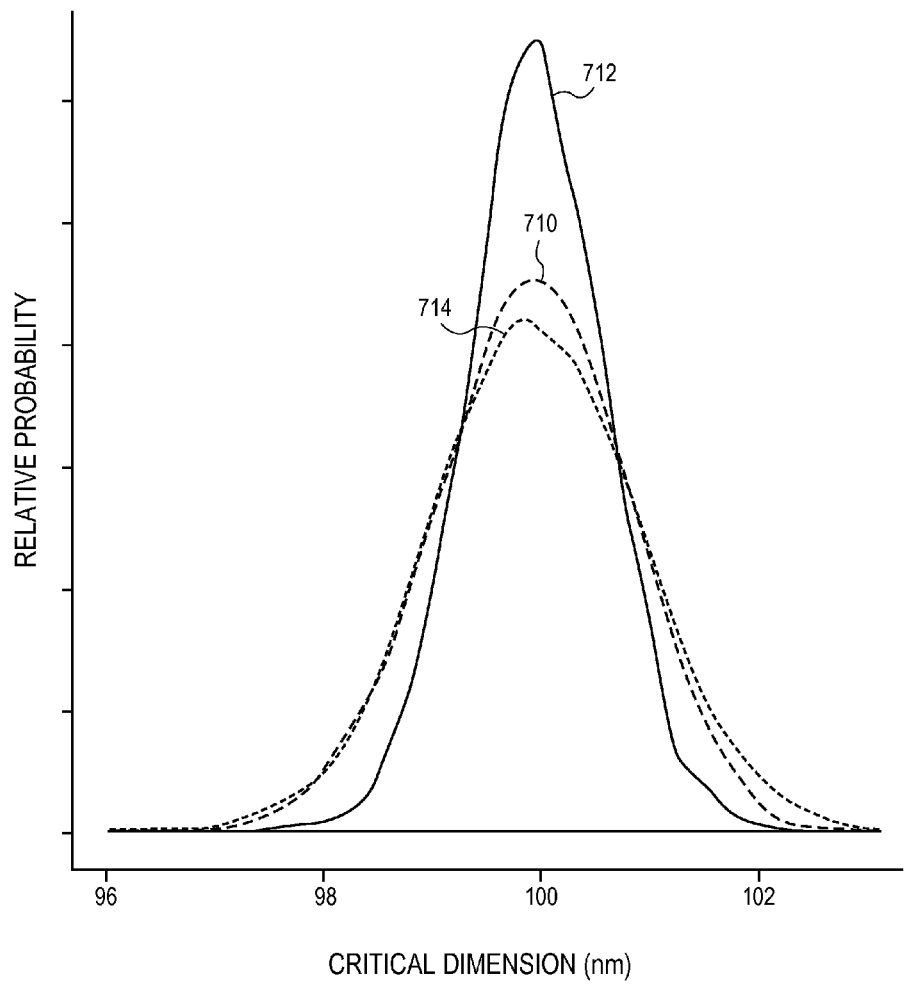
FIG. 7 illustrates a graph of critical dimension (CD) probability for three shot configurations where reticle write time varies among configurations.

In the experiment of FIG. 6, shot-to-shot spacing is constant in the various shot configurations. In general, however, shot-to-shot spacing may also be varied. If shot-to-shot spacing is increased, for example, the number of shots decreases, and therefore the time required to write the pattern on a reticle decreases. FIG. 7 illustrates CD distributions for a conventional set of shots and two configurations of overlapping shots:
- Curve 710 illustrates a CD distribution for a set of conventional non-overlapping VSB shots. The 6 sigma CDU is 4.8 nm.
- Curve 712 illustrates a CD distribution for a CDU-optimized set of overlapping VSB shots, where the write time is the same as for the conventional non-overlapping shots. The 6 sigma CDU is 3.2 nm.
- Curve 714 illustrates a CD distribution for a CDU-optimized set of overlapping VSB shots, where the write time is 70% of the write time for the conventional non-overlapping shots. The 6 sigma CDU is 4.8 nm.

As in the experiment of FIG. 6, manufacturing variation in shot dosage and shot position were calculated in this experiment. In this experiment, all three shot configurations used the same pre-PEC dosage, before the effects of manufacturing variation were added. In other embodiments, shots with different assigned dosages, with the resultant dose margin variation, are also possible. The CDU distributions illustrated in FIG. 7 show that the flexibility allowed by using overlapping shots allow CDU to be improved over conventional non-overlapping shots while maintaining write time, or allow write time to be reduced while maintaining CDU. Other solutions may be found in between these two solutions, where CDU and write time are simultaneously improved.

In the experiments above, for each set of shots in a unique Monte Carlo simulation, the reticle image may be calculated using charged particle beam simulation. Effects that may be included in a mask model used by the charged particle beam simulation include forward scattering, backward scattering, resist diffusion, Coulomb effect, etching, fogging, loading and resist charging.

In the experiments above, CD distributions on the reticle or photomask have been calculated. In other embodiments, double simulation may be used, in which a substrate aerial image is calculated using an optical lithography process with the simulated reticle image. Lithography simulation may be used to calculate the substrate aerial image. Double simulation is disclosed in the U.S. Patent Applications listed in the Related Applications section of this disclosure.

Figure 8:
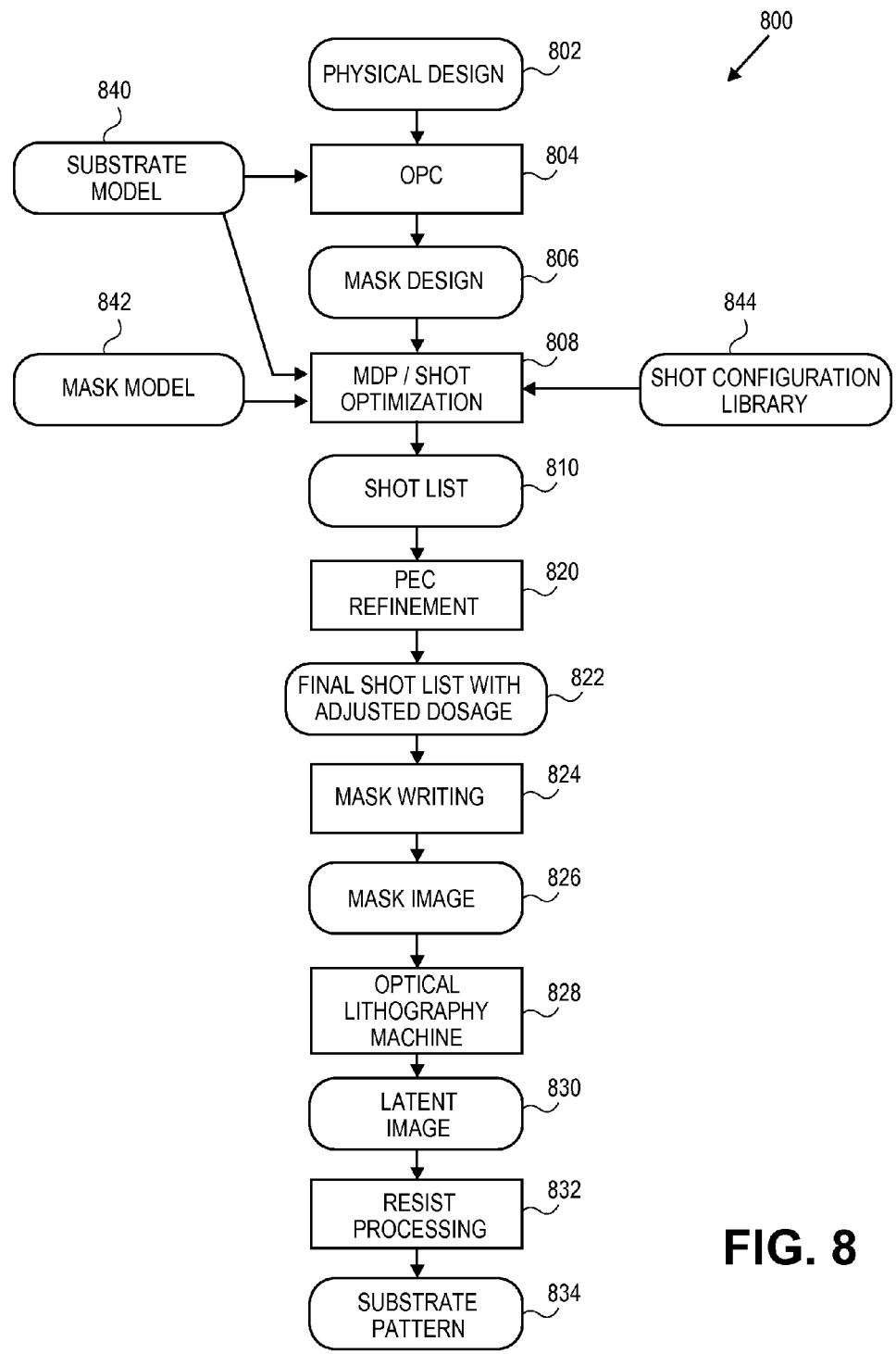
FIG. 8 illustrates a conceptual flow diagram of an exemplary method of how to prepare a surface, such as a reticle, for use in fabricating a substrate such as an integrated circuit on a silicon wafer using optical lithography.

FIG. 8 is a conceptual flow diagram 800 for forming patterns on substrates such as a silicon wafer using optical lithography, according to another embodiment of the current disclosure. In a first step 802, a physical design, such as a physical design of an integrated circuit, is created. This can include determining the logic gates, transistors, metal layers, and other items that are required to be found in a physical design such as the physical design of an integrated circuit. Next, in a step 804, OPC is done on the patterns in the physical design 802 or on a portion of the patterns in the physical design to create a mask design 806. The OPC step 804 uses a substrate model 840 which incorporates lithography and substrate processing effects, but which does not incorporate charged particle beam exposure and reticle processing effects. Substrate processing effects may include, for example, substrate resist bake and substrate resist development. In some embodiments, OPC may comprise inverse lithography technology (ILT). In step 808, the mask design 806 is fractured into a set of charged particle beam shots, shot list 810. Shots may overlap. In some embodiments the shots will be VSB shots. In other embodiments the shots will be CP shots or a combination of VSB and CP shots. Mask data preparation (MDP) optimization 808 may comprise calculating CDU for one or more potential shot configurations, and may comprise calculating a CD distribution by varying one or more manufacturing parameters. In one embodiment, Monte Carlo analysis may be used to calculate the CD distribution. MDP 808 also uses a mask model 842 as input. Physical phenomena that may be included in mask model 842 include forward scattering, backward scattering, Coulomb effect, fogging, resist charging, loading, resist bake, resist development, and resist etch. In some embodiments MDP 808 may use lithography simulation to calculate an aerial image on a substrate using the substrate model 840. The substrate model 840 may include optical lithography effects, and may also include resist effects such as resist bake and resist development. MDP 808 may include optimization of the CDU on the mask image 826, and/or may include optimization of the aerial image CDU on the substrate. MDP 808 may input sets of pre-computed shots from a shot configuration library 844. The shot configuration library 844 may comprise a look-up table which specifies a shot aspect ratio to use for a given pattern shape and configuration. MDP 808 may include mask process correction (MPC). MDP 808 outputs shot list 810.

In a proximity effect correction (PEC) refinement step 820, shot dosages of the shots in the shot list 810 are adjusted to account for long-range effects, which may include back scattering, loading, fogging, and resist charging. The output of PEC refinement 820 is a final shot list with adjusted dosages 822. The final shot list with adjusted dosages 822 is used to generate a surface in a mask writing step 824, which uses a charged particle beam writer such as an electron beam writer system. Depending on the type of charged particle beam writer being used, PEC refinement 820 may be performed by the charged particle beam writer. Mask writing step 824 may comprise a single exposure pass or multiple exposure passes. The electron beam writer system projects a beam of electrons onto a resist-coated surface to form a mask image comprising patterns on the surface as shown in a step 826. After additional processing steps (not illustrated), the completed surface may then be used in an optical lithography machine, which is shown in a step 828, to expose a resist-coated substrate such as a silicon wafer to create a latent image 830 on the resist. The exposed substrate then undergoes additional resist processing steps 832, such as resist baking and resist development, to create a pattern 834 on the substrate.

Figure 9:
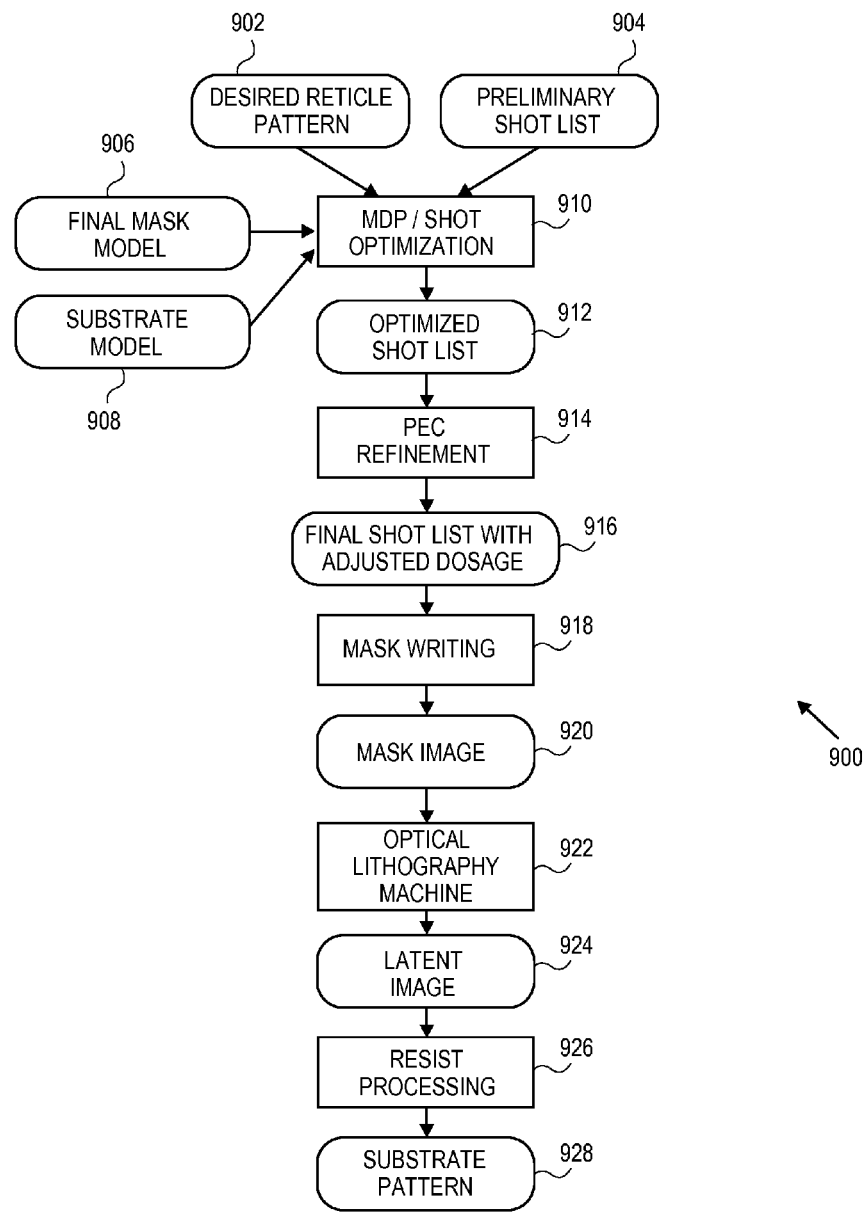
FIG. 9 illustrates a conceptual flow diagram of an exemplary method for optimizing a pre-existing shot list.

FIG. 9 is a conceptual flow diagram 900 for optimizing a pre-existing shot list. Flow 900 begins with a desired reticle pattern 902 and a preliminary shot list 904, where the preliminary shot list 904 is capable of approximately forming the desired reticle pattern 902. MDP step 910 modifies shots in preliminary shot list 904, to create a resulting optimized shot list 912 that is capable of forming a desired reticle pattern 902 more accurately than the preliminary shot list 904. Shots in the optimized shot list 912 may overlap, and may have different assigned dosages. MDP/shot optimization 910 may comprise calculating CDU for one or more potential shot configurations, and may comprise calculating a CD distribution by varying one or more manufacturing parameters. In one embodiment, Monte Carlo analysis may be used to calculate the CD distribution. MDP/shot optimization 910 also uses a final mask model 906 as input. Physical phenomena that may be included in final mask model 906 include forward scattering, backward scattering, Coulomb effect, fogging, resist charging, loading, resist bake, resist development, and resist etch. In some embodiments MDP/shot optimization 910 may use lithography simulation to calculate an aerial image on a substrate using substrate model 908. The substrate model 908 may include optical lithography effects, and may also include resist effects such as resist bake and resist development. In some embodiments, such as when a CD distribution is calculated, charged particle beam and/or lithography simulations may be run for multiple conditions, such as which represent manufacturing variation. In one of these embodiments, the optimization may comprise calculating a score which incorporates the effects of manufacturing variation. MDP/shot optimization 910 may include optimization of the CDU on the mask image 920, and/or may include optimization of the aerial image CDU on the substrate. MDP 910 may also include mask process correction (MPC). In a proximity effect correction (PEC) refinement step 914, shot dosages of the shots in the optimized shot list 912 are adjusted to account for long-range effects, which may include back scattering, loading, fogging, and resist charging. The output of PEC refinement 914 is a final shot list 916. The final shot list 916 is used to generate a surface in a mask writing step 918, which uses a charged particle beam writer such as an electron beam writer system. Depending on the type of charged particle beam writer being used, PEC refinement 914 may be performed by the charged particle beam writer. Mask writing step 918 may comprise a single exposure pass or multiple exposure passes. The electron beam writer system projects a beam of electrons through a stencil onto a surface to form a mask image comprising patterns on the surface as shown in a step 920. After further processing steps (not illustrated), the completed surface may then be used in an optical lithography machine, which is shown in a step 922, to expose a resist-coated substrate such as a silicon wafer to create a latent image 924 on the resist. The exposed substrate then undergoes additional resist processing steps 926, such as resist baking and resist development, to create a pattern 928 on the substrate.

Flow 900 may be useful when, for example, the reticle processing steps have changed since the preliminary shot list 904 was created, causing a mask model change, which requires re-optimization of the shots in the preliminary shot list 904.

Figure 10:
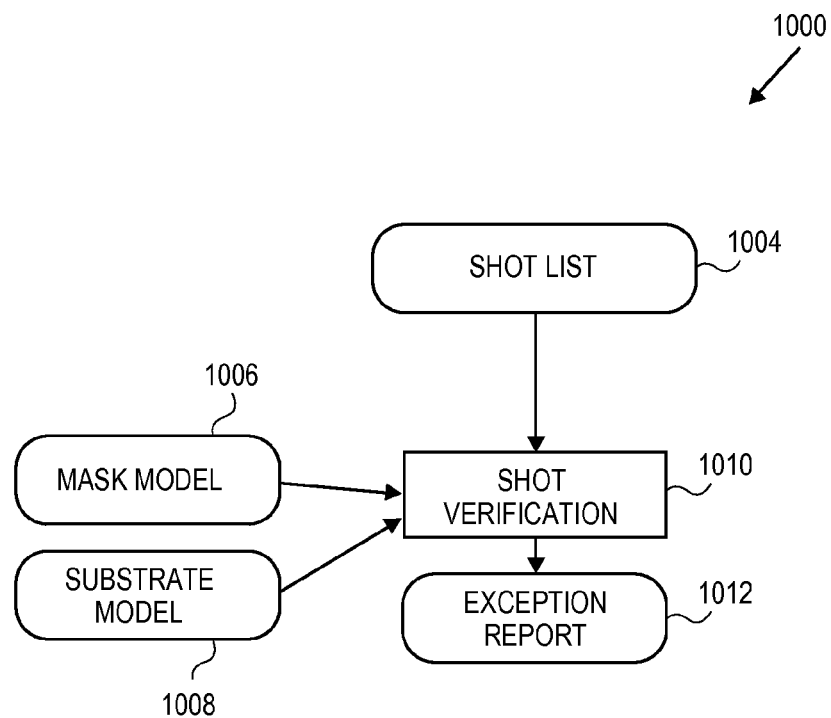
FIG. 10 illustrates a conceptual flow diagram of an exemplary method for verification of a pre-existing shot list.

An existing shot list may be verified to determine if the CDU is within a pre-determined tolerance in light of expected manufacturing variation. FIG. 10 is a conceptual flow diagram 1000 of one embodiment of this technique. The input to the process is an existing shot list 1004. In shot verification step 1010 a reticle pattern is calculated for each of a plurality of shot list variations, wherein each shot in each shot list variation incorporates effects of manufacturing variation, and wherein the calculation of each reticle pattern also incorporates the effects of manufacturing variation. Therefore, each calculated reticle pattern represents a different reticle manufacturing condition. The reticle pattern calculation of step 1010 uses a mask model 1006 as input. A CD is measured at one or more locations for each calculated reticle pattern. CDUs are calculated for each location using the CDs from each of the plurality of calculated reticle patterns. CDUs that are larger than a pre-determined tolerance are non-conforming, and are output to an exception report 1012. In some embodiments, shot verification 1010 may comprise double simulation, where an aerial image on a substrate such as a wafer is calculated for each reticle pattern, such as using lithography simulation. In this case a substrate model 1008 is also input to shot verification 1010. In these embodiments using double simulation, a CD is measured at each measurement location of each aerial image, and a substrate CDU is calculated for each measurement location from the aerial image CD of each shot list variation.

A shot configuration that will produce a minimum CDU for a given situation may be pre-calculated, and information about this shot configuration stored in a table. For example, a situation may be a linear track with 100 nm width, angled 40 degrees from the x-axis, for which a shot configuration is to be pre-calculated. In addition to the track itself, the situation may include the nearby environment. In this example the environment may comprise a plurality of at least 5 parallel 100 nm wide tracks on each side of the track for which shots are to be generated, with adjacent tracks separated by 100 nm spaces. In determining the best shot configuration for a given situation, other parameters may also be considered. For example, the shot configuration may be exposed onto a reticle, the reticle processed to create a photomask, the fabricated photomask pattern dimensions measured, and these measured dimensions compared to the calculated pattern dimensions, where the average difference between the calculated and measured dimension is the mean to target (MTT). Only shot configurations which have an MTT below a pre-determined value may be stored in the table.

The calculations described or referred to in this disclosure may be accomplished in various ways. Generally, calculations may be accomplished by in-process, pre-process or post-process methods. In-process calculation involves performing a calculation at the time when its results are needed. Pre-process calculation involves pre-calculating and then storing results for later retrieval during a subsequent processing step, and may improve processing performance, particularly for calculations that may be repeated many times. Calculations may also be deferred from a processing step and then done in a later post-processing step. An example of pre-process calculation is pre-calculating a shot configuration that will produce a minimum CDU for a given situation, and storing information about this shot configuration in a table. Another example of pre-process calculation is a shot group, which is a pre-calculation of dosage pattern information for one or more shots associated with a given input pattern or set of input pattern characteristics. The shot group and the associated input pattern may be saved in a library of pre-calculated shot groups, so that the set of shots comprising the shot group can be quickly generated for additional instances of the input pattern, without pattern re-calculation. In some embodiments, the pre-calculation may comprise simulation of the dosage pattern that the shot group will produce on a resist-coated surface. In other embodiments, the shot group may be determined without simulation, such as by using correct-by-construction techniques. In some embodiments, the pre-calculated shot groups may be stored in the shot group library in the form of a list of shots. In other embodiments, the pre-calculated shot groups may be stored in the form of computer code that can generate shots for a specific type or types of input patterns. In yet other embodiments, a plurality of pre-calculated shot groups may be stored in the form of a table, where entries in the table correspond to various input patterns or input pattern characteristics such as pattern width, and where each table entry provides either a list of shots in the shot group, or information for how to generate the appropriate set of shots. Additionally, different shot groups may be stored in different forms in the shot group library. In some embodiments, the dosage pattern which a given shot group can produce may also be stored in the shot group library. In one embodiment, the dosage pattern may be stored as a two-dimensional (X and Y) dosage map called a glyph.

The fracturing, mask data preparation, shot optimization and verification flows described in this disclosure may be implemented using general-purpose computers with appropriate computer software as computation devices. Due to the large amount of calculations required, multiple computers or processor cores may also be used in parallel. In one embodiment, the computations may be subdivided into a plurality of 2-dimensional geometric regions for one or more computation-intensive steps in the flow, to support parallel processing. In another embodiment, a special-purpose hardware device, either used singly or in multiples, may be used to perform the computations of one or more steps with greater speed than using general-purpose computers or processor cores. In one embodiment, the special-purpose hardware device may be a graphics processing unit (GPU). In another embodiment, the optimization and simulation processes described in this disclosure may include iterative processes of revising and recalculating possible solutions, so as to minimize either the total number of shots, or the total charged particle beam writing time, or some other parameter. In yet another embodiment, an initial set of shots may be determined in a correct-by-construction method, so that no shot modifications are required.

While the specification has been described in detail with respect to specific embodiments, it will be appreciated that those skilled in the art, upon attaining an understanding of the foregoing, may readily conceive of alterations to, variations of, and equivalents to these embodiments. These and other modifications and variations to the present methods for fracturing, mask data preparation, proximity effect correction and optical proximity correction may be practiced by those of ordinary skill in the art, without departing from the spirit and scope of the present subject matter, which is more particularly set forth in the appended claims. Furthermore, those of ordinary skill in the art will appreciate that the foregoing description is by way of example only, and is not intended to be limiting. Steps can be added to, taken from or modified from the steps in this specification without deviating from the scope of the invention. In general, any flowcharts presented are only intended to indicate one possible sequence of basic operations to achieve a function, and many variations are possible. Thus, it is intended that the present subject matter covers such modifications and variations as come within the scope of the appended claims and their equivalents.

What is claimed is:

1. A method for mask data preparation (MDP) or mask process correction (MPC) for use with charged particle beam simulation, the method comprising:
   determining a set of charged particle beam shots, wherein the set of shots, when used in a charged particle beam writer, produces a dosage on a resist-coated surface, wherein the dosage on the resist-coated surface forms a pattern on the surface,
   wherein critical dimension uniformity (CDU) caused by manufacturing variation is optimized by varying at least two factors selected from the group consisting of shot shape, shot size in one dimension or both dimensions, shot position, shot-to-shot spacing, shot overlap, shot dosage before proximity effect correction, dose margin, critical dimension split, sliver reduction, shot count, and write time, and
   wherein the determining is performed using a computing hardware device.

2. The method of claim 1 wherein varying a shot shape comprises varying between rectilinear and curvilinear.

3. The method of claim 1 wherein the shots in the set of shots are variable shaped beam (VSB) shots.

4. A method for mask data preparation (MDP) or mask process correction (MPC) for use with charged particle beam simulation, the method comprising:
   determining a set of charged particle beam shots, wherein the set of shots, when used in a charged particle beam writer, produces a dosage on a resist-coated surface, wherein the dosage on the resist-coated surface forms a pattern on the surface, wherein model-based techniques are used, and wherein shot count is reduced while maintaining critical dimension uniformity (CDU) caused by manufacturing variation, wherein the model-based techniques comprise calculating a pattern that will be produced on the surface using the set of charged particle beam shots, and
   wherein the determining is performed using a computing hardware device.

5. The method of claim 4 wherein the model-based techniques comprise determining overlapping shots, and determining shots which have differing dosages before proximity effect correction (PEC).

6. The method of claim 4 wherein the calculating comprises charged particle beam simulation.

7. A method for mask data preparation (MDP) or mask process correction (MPC) for use with charged particle beam simulation, the method comprising:
   inputting a set of charged particle beam shots, wherein the set of shots, when used in a charged particle beam writer, produces a dosage on a resist-coated surface, wherein the dosage on the resist-coated surface forms a pattern on the surface; and
   modifying one or more shots in the set of shots to optimize critical dimension uniformity (CDU) caused by manufacturing variation, wherein the modifying comprises varying at least two factors selected from the group consisting of shot shape, shot size in one dimension or both dimensions, shot position, shot-to-shot spacing, shot overlap, shot dosage before proximity effect correction, critical dimension split, sliver reduction, shot count, and write time, and
   wherein the modifying is performed using a computing hardware device.

8. The method of claim 7 wherein varying a shot shape comprises varying between rectilinear shape and curvilinear.

9. A method for mask data preparation (MDP) or mask process correction (MPC) for use with charged particle beam simulation, the method comprising:
   determining a set of charged particle beam shots, wherein the set of shots, when used in a charged particle beam writer, produces a dosage on a resist-coated surface, wherein the dosage on the resist-coated surface forms a pattern on the surface, wherein critical dimension uniformity (CDU) caused by manufacturing variation is optimized by calculating the pattern that will be produced on the surface when varying a factor selected from the group consisting of shot shape, shot size in one dimension or both dimensions, shot position, shot-to-shot spacing, shot overlap, shot dosage before proximity effect correction, dose margin, critical dimension split, sliver reduction, shot count, and write time, and wherein the determining is performed using a computing hardware device.

10. The method of claim 9 wherein a configuration of shots in the set of charged particle beam shots is pre-computed.

11. The method of claim 10 wherein the configuration of shots is stored in a shot configuration library.

12. The method of claim 11 wherein the pattern is comprised of a multiplicity of shapes in a plurality of configurations, and wherein the shot configuration library contains a look-up table which specifies a shot aspect ratio to use for a given pattern shape and configuration.

13. The method of claim 9 wherein the pattern comprises a track, wherein opposing edges of the track are approximately parallel for a majority of a length of the track.

14. The method of claim 13 wherein the track is described by at least one width and an angle.

15. The method of claim 10 wherein the configuration of shots is computed using Monte Carlo simulation that varies a plurality of factors selected from the group consisting of shot shape, shot size in one dimension or both dimensions, shot position, shot-to-shot spacing, shot overlap, shot dosage before proximity effect correction, critical dimension split, sliver reduction, shot count, and write time.

16. The method of claim 15 wherein varying a shot shape comprises varying between rectilinear and curvilinear.

17. The method of claim 9 wherein the determined set of charged particle beam shots is used as input to a proximity effect correction , in which shot dosages are adjusted to account for long-range effects selected from a group consisting of back scattering, loading, fogging and resist charging.

18. A method for mask data preparation (MDP) or mask process correction (MPC) for use with charged particle beam simulation, the method comprising:
   inputting a set of charged particle beam shots, wherein the set of shots, when used in a charged particle beam writer, produces a dosage on a resist-coated surface, wherein the dosage on the resist-coated surface forms a pattern on the surface; and modifying one or more shots in the set of shots to optimize critical dimension uniformity (CDU) of the surface pattern caused by manufacturing variation, wherein the modifying comprises changing a shot shape, shot size, shot position or shot dosage before proximity effect correction, or adding or a shot, wherein the optimization comprises calculating the pattern that will be produced on the surface from the modified set of shots, and wherein the modifying is performed using a computing hardware device.

19. A method for mask data preparation (MDP) or mask process correction (MPC) for use with charged particle beam simulation, the method comprising:

determining a set of charged particle beam shots, wherein the set of shots, when used in a charged particle beam writer, produces a dosage on a resist-coated reticle, wherein the dosage on the resist-coated reticle forms a reticle pattern on the reticle, wherein the reticle, when used in an optical lithographic process, forms a substrate pattern on a substrate, wherein the substrate pattern comprises wafer critical dimensions, wherein the determining comprises optimization of wafer critical dimension uniformity (CDU) caused by reticle manufacturing variation, wherein the optimization comprises calculating a calculated reticle pattern caused by varying a factor selected from the group consisting of shot shape, shot size in one dimension or both dimensions, shot position, shot-to-shot spacing, shot overlap, shot dosage before proximity effect correction, dose margin, critical dimension split, sliver reduction, shot count, and write time, and wherein the determining is performed using a computing hardware device.

20. The method of claim 19 wherein the determining further comprises:

calculating a calculated substrate pattern on the substrate using the calculated reticle pattern.

21. The method of claim 19 wherein a configuration of shots in the set of charged particle beam shots is pre-computed.

22. The method of claim 21 wherein the configuration of shots is stored in a shot configuration library.

23. The method of claim 22 wherein the reticle pattern is comprised of a multiplicity of shapes in a plurality of configurations, and wherein the shot configuration library contains a look-up table which specifies a shot aspect ratio to use for a given shape and configuration.

24. A method for mask data preparation (MDP) or mask process correction (MPC) for use with charged particle beam simulation, the method comprising:

inputting a set of charged particle beam shots, wherein the set of shots, when used in a charged particle beam writer, produces a dosage on a resist-coated reticle, wherein the dosage on the resist-coated reticle forms a reticle pattern on the reticle, wherein the reticle, when used in an optical lithographic process, forms a pattern on a substrate, wherein the pattern on the substrate comprises wafer critical dimensions; and modifying one or more shots in the set of shots to optimize wafer critical dimension uniformity (CDU) caused by reticle manufacturing variation, wherein the modifying comprises changing a shot shape, shot size, shot position or shot dosage before proximity effect correction, or adding or a shot, wherein the optimization comprises calculating a pattern that will be produced on the reticle using the modified set of charged particle beam shots, and wherein the modifying is performed using a computing hardware device.

25. A method for mask data preparation (MDP) for use with charged particle beam lithography comprising:

inputting a set of charged particle beam shots;

calculating a pattern on a surface from the set of charged particle beam shots, using a computing hardware device;

calculating a critical dimension uniformity (CDU) caused by manufacturing variation for the calculated pattern; and modifying the set of charged particle beam shots to improve the CDU for a location, if the CDU for that location exceeds a pre-determined CDU tolerance, wherein the modifying comprises i) changing a shot shape, shot size, shot position or shot dosage before proximity effect correction, or ii) adding a shot.

26. The method of claim 25 wherein the modifying uses model-based techniques, wherein the model-based techniques comprise calculating a pattern that will be produced on the surface using the set of charged particle beam shots.

27. The method of claim 25 wherein calculating the CDU includes at least one of calculating dose margin, calculating critical dimension split effects, and calculating sliver effects.

28. The method of claim 25 wherein calculating the pattern on the surface comprises charged particle beam simulation.

29. The method of claim 25 wherein calculating the pattern on the surface comprises calculating a separate pattern for each of a plurality of reticle manufacturing conditions, and wherein calculating the CDU comprises calculating a CDU for each of the plurality of manufacturing conditions.

* * * * *